(12) United States Patent
Chen et al.

(10) Patent No.: US 9,837,477 B2
(45) Date of Patent: Dec. 5, 2017

(54) ARRAY SUBSTRATE AND METHOD OF MANUFACTURING THE SAME

(71) Applicant: BOE Technology Group Co., Ltd., Beijing (CN)

(72) Inventors: Jiangbo Chen, Beijing (CN); Jun Cheng, Beijing (CN); Chunsheng Jiang, Beijing (CN); Xiaodi Liu, Beijing (CN); Xiangyong Kong, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 15/122,172

(22) PCT Filed: Sep. 25, 2015

(86) PCT No.: PCT/CN2015/090687
§ 371 (c)(1),
(2) Date: Aug. 28, 2016

(87) PCT Pub. No.: WO2016/145822
PCT Pub. Date: Sep. 22, 2016

(65) Prior Publication Data
US 2017/0077201 A1     Mar. 16, 2017

(30) Foreign Application Priority Data
Mar. 16, 2015 (CN) .......................... 2015 1 0114304

(51) Int. Cl.
*H01L 27/32* (2006.01)
*H01L 21/77* (2017.01)
*H01L 51/56* (2006.01)

(52) U.S. Cl.
CPC .......... *H01L 27/3262* (2013.01); *H01L 21/77* (2013.01); *H01L 51/56* (2013.01); *H01L 2227/323* (2013.01)

(58) Field of Classification Search
CPC ............... H01L 27/3244; H01L 29/786; H01L 29/66742; H01L 29/66969;
(Continued)

(56) References Cited

U.S. PATENT DOCUMENTS

| 6,335,276 B1 | 1/2002 | Park et al. |
| 6,621,545 B2 | 9/2003 | Park et al. |

(Continued)

FOREIGN PATENT DOCUMENTS

| CN | 1512830 A | 7/2004 |
| CN | 1516244 A | 7/2004 |

(Continued)

OTHER PUBLICATIONS

First Office Action, including Search Report, for Chinese Patent Application No. 201510114304.5, dated Feb. 13, 2017, 13 pages.
(Continued)

*Primary Examiner* — Michael Carter
*Assistant Examiner* — Mohammed R Alam
(74) *Attorney, Agent, or Firm* — Westman, Champlin & Koehler, P.A.

(57) ABSTRACT

Embodiments of the invention provide an array substrate and a method of manufacturing the same. The method comprises: forming a gate electrode pattern, a gate insulation layer, an active layer pattern and an etching stopping layer on a substrate; forming a photoresist layer on the etching stopping layer; performing a single patterning process on the photoresist layer, such that photoresist in the first region is partially etched off, photoresist in the second region is completely etched off, and photoresist in the third region is
(Continued)

completely remained; and performing a single etching process, such that residual photoresist in the first region and a portion of the etching stopping layer in the first region are etched off, and at the same time, a portion of the etching stopping layer and a portion of the gate insulation layer in the second region are etched off.

20 Claims, 4 Drawing Sheets

(58) Field of Classification Search
CPC ........... H01L 29/78618; H01L 29/7869; H01L 27/32; H01L 27/3262; H01L 27/3265; H01L 27/1214; H01L 27/1288; H01L 23/4824; H01L 27/1225; H01L 29/4908; H01L 2924/0002; H01L 2924/12044; G02F 1/1333; G02F 2001/136231
See application file for complete search history.

(56) References Cited

U.S. PATENT DOCUMENTS

| | | | |
|---|---|---|---|
| 7,202,502 B2 | 4/2007 | Park et al. | |
| 7,247,878 B2 | 7/2007 | Park et al. | |
| 7,537,977 B2 | 5/2009 | Park et al. | |
| 7,550,306 B2 | 6/2009 | Park et al. | |
| 7,888,677 B2 | 2/2011 | Park et al. | |
| 8,786,793 B2 | 7/2014 | Yamazaki | |
| 2004/0067445 A1* | 4/2004 | Park | G02F 1/13458 430/311 |
| 2007/0096100 A1 | 5/2007 | Lee et al. | |
| 2010/0301327 A1* | 12/2010 | Kang | G02F 1/1333 257/43 |
| 2016/0005799 A1* | 1/2016 | Wang | H01L 29/66969 257/40 |

FOREIGN PATENT DOCUMENTS

| | | |
|---|---|---|
| CN | 1956224 A | 5/2007 |
| CN | 101355037 A | 1/2009 |
| CN | 102629584 A | 8/2012 |
| CN | 102636927 A | 8/2012 |
| CN | 102637631 A | 8/2012 |
| CN | 103715267 A | 4/2014 |
| CN | 104637874 A | 5/2015 |

OTHER PUBLICATIONS

International Search Report and Written Opinion, including English translation of Box No. V, for International Application No. PCT/CN2015/090687, dated Dec. 30, 2015, 12 pages.

Second Office Action from Chinese Patent Application No. 201510114304.5, dated Aug. 25, 2017, 15 pages.

* cited by examiner

ARRAY SUBSTRATE AND METHOD OF MANUFACTURING THE SAME

CROSS-REFERENCE TO RELATED APPLICATION

This Application is a Section 371 National Stage Application of International Application No. PCT/CN2015/090687, filed 25 Sep. 2015, which has not yet published, in Chinese, the contents of which are hereby incorporated by reference in their entirety.

TECHNICAL FIELD

The present disclosure relates to the field of display technologies, and specifically, to an array substrate and a method of manufacturing the same.

BACKGROUND

A pixel driving circuit of an active matrix driving organic light emitting diode (AMOLED) display panel generally includes at least two thin film transistors (TFT) and a storage capacitor. One of the TFTs is a switching TFT and the other one is a driving TFT. FIG. 1 is a schematic view showing a structure of a pixel of an AMOLED array substrate including a pixel driving circuit. The array substrate includes: a substrate 1; a gate electrode pattern formed on the substrate 1, the gate electrode pattern being consisted of a gate electrode 2a of a switching TFT and a gate electrode 2b of a driving TFT, as shown in the figure; a gate insulation layer 3 formed above the gate electrode pattern; an active layer pattern 4 formed above the gate insulation layer 3 in a region above the gate electrode 2a, the active layer pattern 4 being absent at a region above the gate electrode 2b; an etching stopping layer 5 formed above the active layer pattern 4 and the gate insulation layer 3; and a source and drain electrodes pattern formed above the etching stopping layer 5, the source and drain electrodes pattern including a source and drain electrodes 6a of the switching TFT and a source and drain electrodes 6b of the driving TFT. The source and drain electrodes 6a of the switching TFT is connected with the active layer pattern 4 via a source electrode via-hole A11 and a drain electrode via-hole A12 in the etching stopping layer 5, the drain electrode is connected with the active layer pattern 4 via the drain electrode via-hole A12 in the etching stopping layer 5, and the source and drain electrodes 6b of the driving TFT is connected with the gate electrode 2b via a via-hole B1 in the etching stopping layer 5. A resin layer 7 is further formed above the source and drain electrodes pattern, and a pixel electrode pattern is further formed above the resin layer 7. The resin layer 7 is provided with via-holes (not indicated in FIG. 1) at positions corresponding to the source electrode and the drain electrode of the source and drain electrodes 6a, and the resin layer 7 is also provided with a via-hole (not indicated in FIG. 1) at a position corresponding to the source and drain electrodes 6b. The pixel electrode pattern 8 is connected with the source and drain electrodes 6b through a via-hole A22 and a via-hole B2. A via-hole A21 is used to connect with a data line. When a scan line is turned on, a certain voltage is applied on the gate electrode 2a of the switching TFT such that a current flows from source electrode of the switching TFT to the drain electrode of the switching TFT, and flows to the driving TFT via the pixel electrode pattern 8 to turn on the driving TFT, and the current flows from a source electrode to a drain electrode, and the driving TFT is communicated with a storage capacitor (not shown) such that the capacitor is charged. When the scan line is turned off, voltage of in the capacitor can maintain the driving TFT at a turned-on state, and thus a constant current of the OLED can be maintained within a frame.

In prior art, there are two approaches for manufacturing the via-holes A11, A12, B1, one is as follows: after depositing the gate insulation layer 3, forming the active layer pattern 4 and depositing the etching stopping layer 5, photoresist is applied on the etching stopping layer 5, and a single patterning process is performed to form a photoresist removed region at regions above the via-holes A11, A12, B1, then a dry etching process is performed until the gate insulation layer and the etching stopping layer in a region corresponding to the via-hole B1 are completely etched off. This approach may save one patterning process. However, as a thickness that needs to be etched off in the region corresponding to the via-hole B1 is larger than a thickness that needs to be etched off in the regions corresponding to via-holes A11, A12, when a material of the etching stopping layer 5 in the regions corresponding to via-holes A11, A12 are completely etched off, the gate insulation layer 3 in the region corresponding to the via-hole B1 is not completely etched off, under the same etching process. In this instance, if the etching process is continued on the gate insulation layer 3 in the region corresponding to the via-hole B1, an upper portion of the active layer pattern 4 in the region corresponding to via-holes A11, A12 will be damaged. The other approach is as follows: after the gate insulation layer 3 is formed, a single patterning process is performed to form a via-hole in the gate insulation layer 3 in the region B1 firstly, then after the etching stopping layer 5 is formed, via-holes in the etching stopping layer 5 respectively at the regions A11, A12, B1 are formed through a single patterning process. This approach may effectively prevent the active layer pattern 4 from being damaged. However, since one more patterning process is needed, difficulty in manufacturing the array substrate is increased.

SUMMARY

An object of the present invention to form a via-hole of a switching TFT and a via-hole of a driving TFT by a single patterning process, and to decrease degree of damage to channel(s) in a via-hole region of the switching TFT.

According to an aspect of the invention, there is provided a method of manufacturing an array substrate. The array substrate comprises a first region corresponding to a via-hole of a switching transistor, a second region corresponding to a via-hole of a driving transistor, and a third region except the first region and the second region, and the method comprises steps of: forming a gate electrode pattern, a gate insulation layer, an active layer pattern and an etching stopping layer on a substrate; forming a photoresist layer on the etching stopping layer; performing a single patterning process on the photoresist layer, such that photoresist in the first region is partially etched off, photoresist in the second region is completely etched off, and photoresist in the third region is completely remained; and performing a single etching process, such that residual photoresist in the first region and a portion of the etching stopping layer in the first region are etched off, and at the same time, a portion of the etching stopping layer and a portion of the gate insulation layer in the second region are etched off.

According to an exemplary embodiment, the step of performing a single patterning process on the photoresist layer comprises: utilizing the same mask to incompletely expose the photoresist in the first region such that the photoresist in the first region is partially removed and to completely expose the photoresist in the second region such that the photoresist in the second region is completely removed.

According to an exemplary embodiment, utilizing the same mask to expose the photoresist comprises: utilizing a slit mask to expose the photoresist layer, the slit mask having slits at positions corresponding to the first region and an opening at a position corresponding to the second region.

According to an exemplary embodiment, utilizing the same mask to expose the photoresist comprises: utilizing a gray tone mask or a half tone mask to expose the photoresist layer, a portion of the gray tone mask or a portion of the half tone mask at a position corresponding to the first region being semi-transparent while another portion of the gray tone mask or another portion of the half tone mask at a position corresponding to the second region being completely transparent.

According to an exemplary embodiment, the step of forming the photoresist layer on the etching stopping layer comprises: forming the photoresist layer on the etching stopping layer, such that the photoresist in the second region has a first thickness, and the photoresist in the first region has a second thickness larger than the first thickness; and the second thickness is set such that when the portion of the photoresist layer in the first region has been completely etched off, the portion of the etching stopping layer and the portion of the gate insulation layer in the second region have not been completely etched off.

According to an exemplary embodiment, the step of performing a single etching process comprises: ashing off the photoresist in the first region to remove residual photoresist in the first region after the portion of the etching stopping layer and the portion of the gate insulation layer in the second region have been etched off by a certain thickness; and continuing the etching process until the portion of the etching stopping layer in the first region and the portion of the gate insulation layer and the portion of the etching stopping layer in the second region are completely etched off.

According to an exemplary embodiment, ashing off the photoresist in the first region comprises ashing off the residual photoresist in the first region with oxygen plasma.

According to an exemplary embodiment, the gate insulation layer and the etching stopping layer are formed of the same material; and ashing off the photoresist in the first region comprises ashing off the photoresist in the first region to remove the residual photoresist in the first region when a thickness of a remained material to be etched off in the second region is equal to an initial thickness of the portion of the etching stopping layer in the first region.

According to an exemplary embodiment, the gate insulation layer and the etching stopping layer are formed of silicon dioxide.

According to an exemplary embodiment, the method further comprises: depositing a source and drain electrode pattern on the substrate and forming a pixel electrode pattern above the source and drain electrode pattern after the step of performing a single etching process, wherein the source and drain electrode pattern is connected with a drain electrode of the switching transistor and a gate electrode of the driving transistor.

In another aspect of the invention, there is also provided an array substrate, which is manufactured by the method according to any one of the above exemplary embodiments.

With the method of manufacturing an array substrate provided in the present disclosure, since a portion of the photoresist layer above the via-hole of the switching transistor is retained, a thickness of material to be etched off above the active layer of the switching transistor is increased, such that a time period during which the active layer is etched is reduced, and a level of damage to the active layer is decreased. Further, during the etching of the via-hole of the switching transistor and the via-hole of the driving transistor, only one patterning process is used, such that a manufacturing process is simplified.

DETAILED DESCRIPTION OF PREFERRED EMBODIMENTS

Exemplary embodiments of the present disclosure will be described hereinafter detailedly and completely with reference to the attached drawings to make objects, technical themes and advantages of the present disclosure more apparent. Obviously, described embodiments are just a part of its embodiments rather than all its embodiments. All other embodiments obtained based on the embodiments of the present disclosure by those ordinary skilled in the art without an inventive work shall fall within the scope of the present disclosure.

Figure 2:
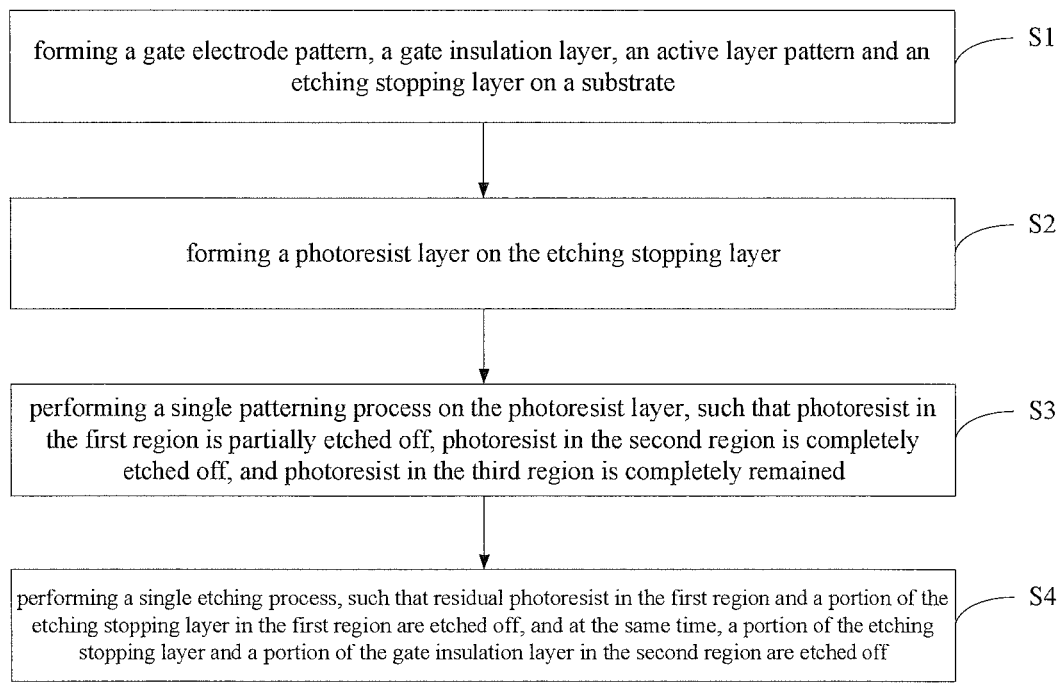
FIG. 2 is a schematic flow chart showing a method of manufacturing an array substrate according to an embodiment of the present disclosure.

An embodiment of the present disclosure provides a method of manufacturing an array substrate, which includes a first region corresponding to a via-hole of a switching transistor, a second region corresponding to a via-hole of a driving transistor, and a third region in addition to the first region and the second region. As shown in FIG. 2. The method includes:

step S1: forming a gate electrode pattern, a gate insulation layer, an active layer pattern and an etching stopping layer on a substrate;

step S2: forming a photoresist layer on the etching stopping layer;

step S3: performing a single patterning process on the photoresist layer, such that photoresist in the first region is partially etched off, photoresist in the second region is completely etched off, and photoresist in the third region is completely remained;

step S4: performing a single etching process, such that residual photoresist in the first region and a portion of the etching stopping layer in the first region are etched off, and a portion of the etching stopping layer and a portion of the gate insulation layer in the second region are etched off at the same time.

In the embodiment of the present disclosure, since a portion of the photoresist layer above the via-hole of the switching transistor is retained, a thickness of material to be etched off above the active layer of the switching transistor is increased, such that a time period during which the active layer is etched is reduced, and a level of damage to the active layer is decreased. Further, during the etching of the via-hole of the switching transistor and the via-hole of the driving transistor, only one patterning process is used, such that a manufacturing process is simplified.

In practice, each of the above steps may be realized in various ways. For example, in an optional embodiment of the above method, step S1 may include the following steps (not shown).

Step S11: providing and cleaning a transparent substrate. The transparent substrate may be a glass substrate.

Step S12: depositing a gate electrode material layer having a thickness of 50 to 400 nm on the transparent substrate through a sputtering process or an evaporating process, and patterning and etching the gate electrode material layer to form the gate electrode pattern.

In practice, the gate electrode material layer may be formed of a metal material. The step of patterning and etching the gate electrode material layer to form the gate electrode pattern may include: applying photoresist on the gate electrode material layer; exposing and developing the photoresist with a mask, such that only the photoresist in a region corresponding to the gate electrode pattern is retained; utilizing an etching liquid to etch the gate electrode material layer using residual photoresist as a protective layer, so as to form the gate electrode pattern.

Figure 3:
FIG. 3 is a schematic view showing a structure of a pixel of an array substrate after step S12.

FIG. 3 is a schematic view showing a structure of a pixel of an array substrate after step S12, which includes a substrate 1, a gate electrode 2a and a gate electrode 2b formed on the substrate.

Step S13: forming a $SiO_x$ layer having a thickness of 100 to 500 nm through a chemical vapor deposition (CVD) process, the $SiO_x$ layer acting as the gate insulation layer.

Figure 4:
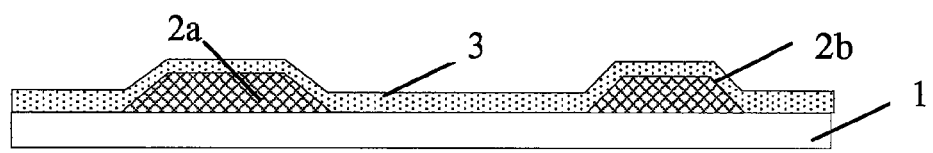
FIG. 4 is a schematic view showing a structure of a pixel of an array substrate after step S13.

A specific process of step S13 may be referred to the prior art, a detailed description thereof is omitted herein. FIG. 4 is a schematic view showing a structure of a pixel of an array substrate after step S13. The structure of FIG. 4 differs from that of FIG. 3 in that the structure of FIG. 4 further includes the gate insulation layer 3 located above the gate electrode 2a and the gate electrode 2b, and the gate insulation layer 3 covers an entire region of the pixel.

Step S14: depositing an active material layer on the gate insulation layer through a sputtering process or an evaporating process, and patterning and etching the active material layer to form the active layer pattern.

Figure 5:
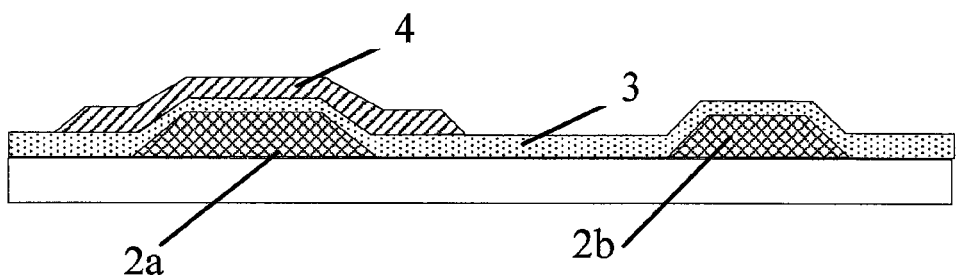
FIG. 5 is a schematic view showing a structure of a pixel of an array substrate after step S14.

A detailed process of step S14 is similar to that of the step S12, and a detailed description thereof is omitted herein. The active material layer may be made of indium gallium zinc oxide (IGZO). FIG. 5 is a schematic view showing a structure of a pixel of an array substrate after step S14. The structure of FIG. 5 differs from that of FIG. 4 in that the structure of FIG. 5 further includes the active material layer 4 located above the gate insulation layer 3, and the active material layer 4 is located above the gate electrode 2a. The active material layer is not disposed over the gate electrode 2b.

Step S15: forming a silicon dioxide layer having a thickness of 50 to 500 nm through a CVD process on the substrate after step S14, the silicon dioxide layer acting as an etching stopping layer.

Figure 6:
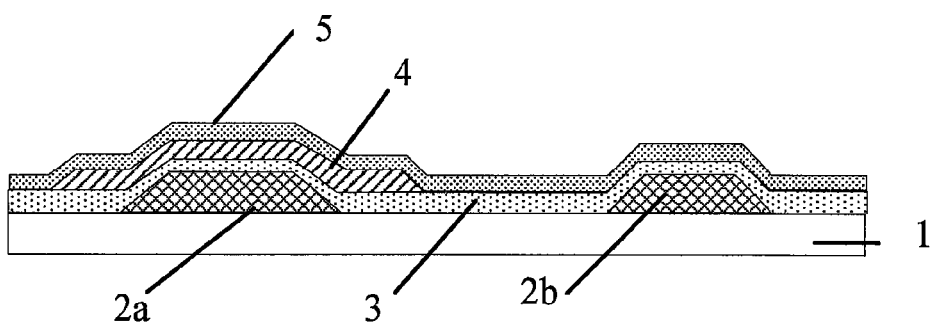
FIG. 6 is a schematic view showing a structure of a pixel of an array substrate after step S15.

FIG. 6 is a schematic view showing a structure of a pixel of an array substrate after step S15. The structure of FIG. 6 differs from that of FIG. 5 in that the structure of FIG. 6 further includes the etching stopping layer 5 located above the active material layer 4 and the gate insulation layer 3, and the etching stopping layer 5 covers an entire region of the pixel. In practice, the etching stopping layer may also be made of silicon nitride.

With the above processes, step S1 is completed. In step S2, after step S1, the photoresist layer may be formed through coating photoresist on the etching stopping layer. The photoresist layer may include a liquid mixture of three main components of a photosensitive resin, a sensitizing agent and a solvent. After the photosensitive resin is irradiated, a photo curing reaction will soon occur in an exposure region, and then a specific solution may be used to remove the cured photosensitive resin.

In practice, the above step S3 may be realized in various ways, one of which may include: incompletely exposing the photoresist in the first region such that the photoresist in the first region is partially removed and completely exposing the photoresist in the second region such that the photoresist in the second region is completely removed with the same mask. Specifically, completely exposing the photoresist in a region means that light completely passes through the region, while incompletely exposing the photoresist in a region means that light partially passes through the region.

The mask may be a slit mask, which has slit(s) in the first region and an opening in the second region. The slit herein means a slit having a width comparable to a wavelength of light utilized herein. When the light passes the slits, it is diffracted at each of the slits, and photoresist underneath the region will be incompletely exposed due to the interference effect under the region. The opening herein means a slit having a width much larger than the wavelength of the light. When the light passes the opening, no significant diffraction occurs, such that photoresist underneath the opening will be completely exposed.

Additionally, the mask used herein may be a gray tone mask or a half tone mask for exposing the photoresist layer, a portion of the gray tone mask or a portion of the half tone mask in the first region is semi-transparent, and another portion in the second region is completely transparent.

Figure 7:
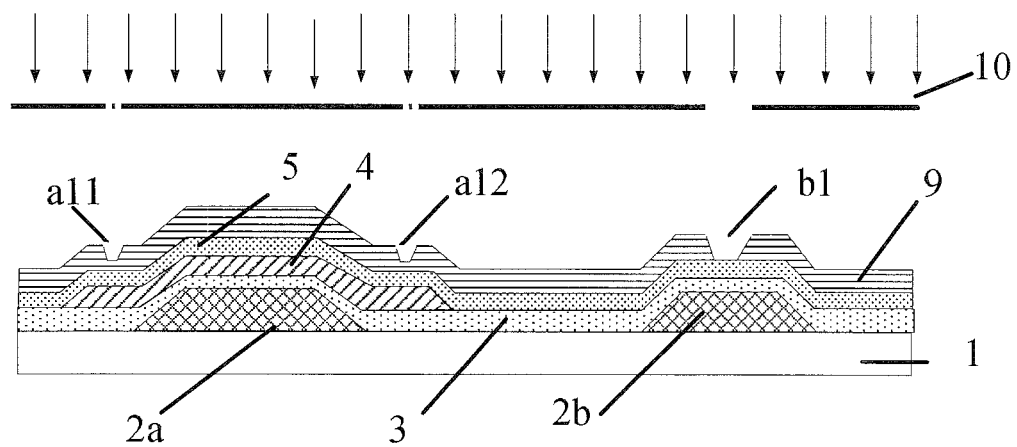
FIG. 7 is a schematic view showing a structure of a pixel of an array substrate after step S3.

FIG. 7 is a schematic view showing a structure of a pixel of an array substrate after step S3, wherein photoresist 9 is applied on the etching stopping layer 5. An area a11 of the photoresist for forming the hole A11 and an area a12 of the photoresist for forming the hole A12 are partially retained, an area b1 of the photoresist for forming the hole B1 is completely removed, and other area of the photoresist 9 are completely retained. FIG. 6 also shows a schematic view of the slit mask 10 that is utilized. The slit mask 10 has a plurality of slits in the areas a11, a12 and an opening in the area b1.

In practice, in step S4, if a thickness of the photoresist material in the first region is moderate, the portion of the etching stopping layer and a portion of the gate insulation layer in the second region may be approximately completely etched off while the portion of the photoresist layer and the portion of the etching stopping layer in the first region have been etched off through the same etching process (such as, a dry etching process), thereby avoiding damage to the active layer pattern or the gate electrode in the regions due to overetching.

In practice, however, it is hard to control the thickness of the photoresist material in the first region. In order to further reduce degree of damage to the active layer pattern in the first region or a damage to the gate electrode in the region where photoresist are completely removed, in an embodiment of the present disclosure, the step S2 may include forming the photoresist layer on the etching stopping layer, such that the photoresist in the second region has a first thickness, and the photoresist in the first region has a second thickness larger than the first thickness.

Further, the second thickness should be set such that when the portion of the photoresist layer in the first region has been completely etched off, the portion of the etching stopping layer and the portion of the gate insulation layer in the second region have not been completely etched.

In this case, the step S4 may include:

After the portion of the etching stopping layer and the portion of the gate insulation layer in the second region have been etched to a certain depth, ashing the photoresist in the first region to remove residual photoresist in the first region; then continuing the etching until the portion of the etching stopping layer in the first region and the portion of the gate insulation layer and the portion of the etching stopping layer in the second region have been completely etched off.

For example, when performing the exposing and developing processes, a thickness of the applied photoresist is generally 1500 nm In the embodiment of the present disclosure, a thickness of the photoresist in the first region may be sized to 2000 nm, in order to have the photoresist with a sufficient thickness in the first region.

Further, if the gate insulation layer and the etching stopping layer are formed of the same material, such as silicon dioxide, then in practice, in the step S4, when a thickness of residual silicon dioxide (a sum of a thickness of the gate insulation layer and a thickness of the etching stopping layer (if there is any left)) in the second region is equal to an initial thickness of the portion of the etching stopping layer in the first region, an ashing process is performed on the photoresist in the first region to remove the residual photoresist in the first region. In such a manner, after the ashing process, the same dry etching process may be performed to completely etch off the material of the etching stopping layer in the first region and completely etch off the material of the gate insulation layer in the second region, thereby avoiding a damage to the active layer pattern and the gate electrode in the region corresponding to the via-hole the driving TFT due to overetching.

Further, if the gate insulation layer and the etching stopping layer have the same thickness and are formed of the same material (for example, silicon dioxide), the residual photoresist in the first region is subjected to an ashing process to remove the residual photoresist in the first region after the portion of the etching stopping layer in the second region have been completely etched off.

The ashing process herein may specifically include: ashing off the residual photoresist in the first region with oxygen plasma. In practice, of course, other gases, such as helium gas, may also be used to ash off the residual photoresist in the first region.

Figure 8:
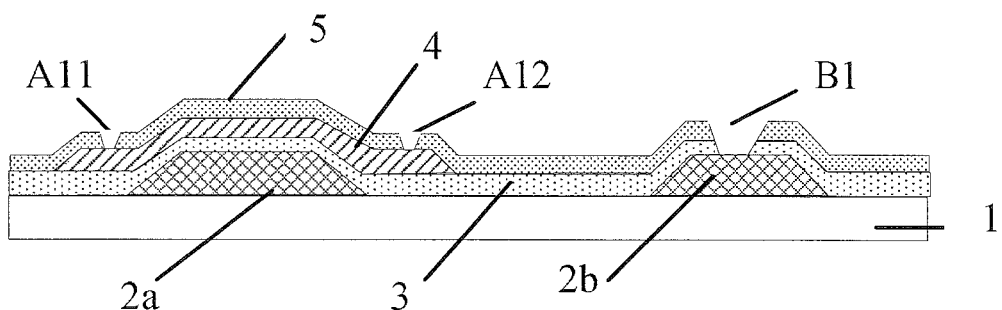
FIG. 8 is a schematic view showing a structure of a pixel of an array substrate after step S4.

After step S4, the etching process for the via-hole of the switching TFT and the via-hole of the driving TFT is completed. FIG. 8 is a schematic view showing a structure of a pixel of an array substrate obtained after step S4. Compared with FIG. 7, the via-hole A11 for a source electrode and the via-hole A12 for the drain electrode are formed, above the gate electrode 2a, in the etching stopping layer 5, and the via-hole B1 is formed, above the gate electrode 2b, in the etching stopping layer 5.

In practice, after step S4, the above method may further include the following step which is not shown in the figures:

step S5: depositing a source and drain metal layer on the substrate after step S4, and forming the source and drain electrodes pattern through a patterning process. The source and drain electrodes pattern includes the source and drain electrodes of the switching TFT and the source and drain electrodes of the driving TFT.

Figure 9:
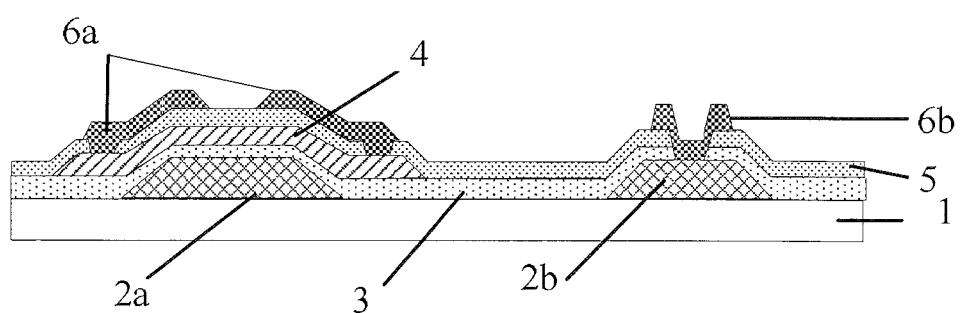
FIG. 9 is a schematic view showing a structure of a pixel of an array substrate after step S5.

FIG. 9 is a schematic view showing a structure of a pixel of an array substrate after step S5. FIG. 9 differs from FIG. 8 in that, in FIG. 9, the source and drain electrodes pattern is further formed on the etching stopping layer 5. The source and drain electrodes pattern includes the source and drain electrodes 6a of the switching TFT and the source and drain electrodes 6b of the driving TFT. The source and drain electrodes 6a of the switching TFT are connected with the active layer pattern 4 via the via-hole A11 for the source electrode and the via-hole A12 for the drain electrode respectively on the etching stopping layer 5, and the source and drain electrodes 6b of the driving TFT are connected with the gate electrode 2 via the via-hole B1 that passes through the etching stopping layer 5 and the gate insulation layer 3.

Figure 10:
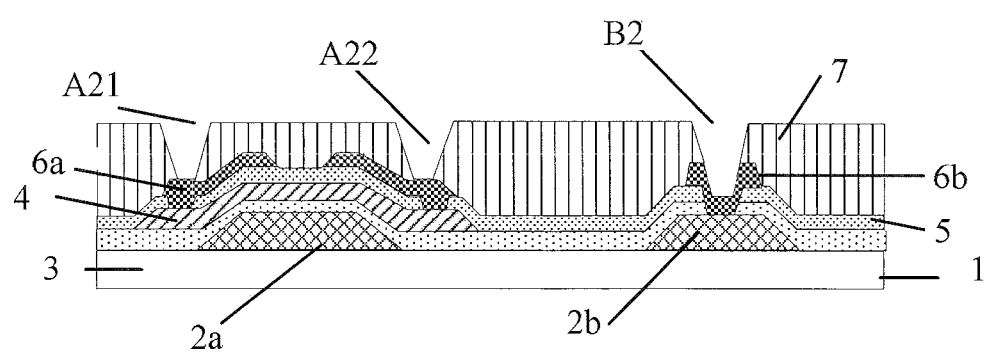
FIG. 10 is a schematic view showing a structure of a pixel of an array substrate after step S6.

In practice, after step S5, the above method may further include the following step which is not shown in the figures:

step S6: forming a resin layer on the source and drain electrodes pattern, and forming two via-holes in the resin layer and above the source and drain electrodes of the switching TFT through a patterning process. FIG. 10 is a schematic view showing a structure of a pixel of an array substrate after step S6. FIG. 10 differs from FIG. 9 in that, in FIG. 10, the resin layer 7 is further formed on the source and drain electrodes pattern, and the resin layer 7 is provided with a via-hole A21 at a position corresponding to the via-hole A11 for the source electrode, a via-hole A22 at a position corresponding to the via-hole A12 for the drain electrode, and a via-hole B2 above the source and drain electrodes 6b.

Figure 1:
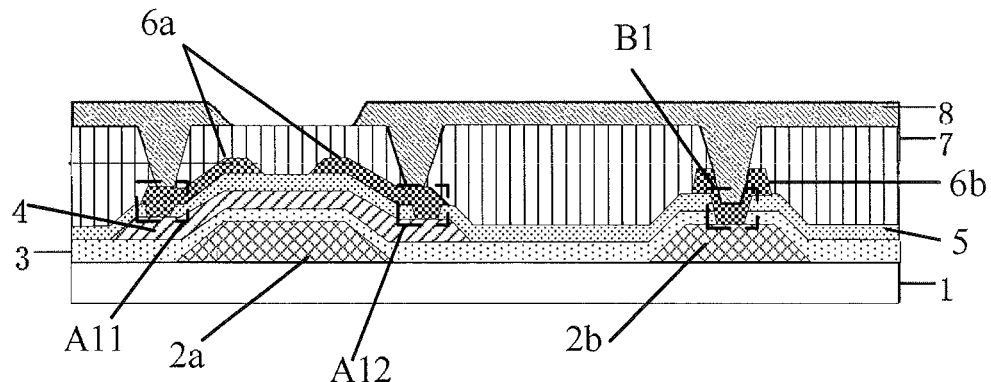
FIG. 1 is a schematic view showing a structure of a pixel of an AMOLED array substrate.

In practice, after step S4, the above method may further include the following step which is not shown in the figures:

step S7: forming a pixel electrode pattern on the resin layer, the pixel electrode pattern being connected with the drain electrode of the switching TFT and the gate electrode of the driving TFT. In practice, a pixel electrode material layer may be formed on the substrate obtained in step S5. Since the pixel electrode material layer will connect the drain electrode of the switching TFT with the gate electrode of the driving TFT after step S6, the pixel electrode pattern may be formed through the patterning process. A schematic view of a structure of a pixel of the substrate on which the pixel electrode pattern has been formed is shown in FIG. 1.

In practice, when the above method is used to manufacture an AMOLED based on Color-On-Array (COA), the method may further include a process of manufacturing a color filter. The above method may be used to manufacture array substrate for a white light OLED (WOLED), a PLED or the like.

The present disclosure further provides an array substrate manufactured through the method according to any one of the above embodiments.

The description above relates to exemplary embodiment of the present disclosure, and a scope of the disclosure is not limited thereto. All obvious changes or modifications made in these embodiments by those skilled in the art shall fall within the scope of the disclosure. Therefore, the scope of which is defined in the claims and their equivalents.

What is claimed is:

1. A method of manufacturing an array substrate, the array substrate comprising a first region corresponding to a via-hole of a switching transistor, a second region corresponding to a via-hole of a driving transistor, and a third region except the first region and the second region, the method comprising steps of:
   forming a gate electrode pattern, a gate insulation layer, an active layer pattern and an etching stopping layer on a substrate;
   forming a photoresist layer on the etching stopping layer;
   performing a single patterning process on the photoresist layer, such that photoresist in the first region is partially etched off, photoresist in the second region is completely etched off, and photoresist in the third region is completely remained; and
   performing a single etching process, such that residual photoresist in the first region and a portion of the etching stopping layer in the first region are etched off, and at the same time, a portion of the etching stopping layer and a portion of the gate insulation layer in the second region are etched off.

2. The method according to claim 1, wherein the step of performing a single patterning process on the photoresist layer comprises:
   utilizing the same mask to incompletely expose the photoresist in the first region such that the photoresist in the first region is partially removed and to completely expose the photoresist in the second region such that the photoresist in the second region is completely removed.

3. The method according to claim 2, wherein utilizing the same mask to expose the photoresist comprises:
   utilizing a slit mask to expose the photoresist layer, the slit mask having slits at positions corresponding to the first region and an opening at a position corresponding to the second region.

4. The method according to claim 2, wherein utilizing the same mask to expose the photoresist comprises:
   utilizing a gray tone mask or a half tone mask to expose the photoresist layer, a portion of the gray tone mask or a portion of the half tone mask at a position corresponding to the first region being semi-transparent while another portion of the gray tone mask or another portion of the half tone mask at a position corresponding to the second region being completely transparent.

5. The method according to claim 1, wherein the step of forming the photoresist layer on the etching stopping layer comprises:
   forming the photoresist layer on the etching stopping layer, such that the photoresist in the second region has a first thickness, and the photoresist in the first region has a second thickness larger than the first thickness; and
   wherein the second thickness is set such that when the portion of the photoresist layer in the first region has been completely etched off, the portion of the etching stopping layer and the portion of the gate insulation layer in the second region have not been completely etched off.

6. The method according to claim 5, wherein the step of performing a single etching process comprises:
   ashing off the photoresist in the first region to remove residual photoresist in the first region after the portion of the etching stopping layer and the portion of the gate insulation layer in the second region have been etched off by a certain thickness; and
   continuing the etching process until the portion of the etching stopping layer in the first region and the portion of the gate insulation layer and the portion of the etching stopping layer in the second region are completely etched off.

7. The method according to claim 6, wherein ashing off the photoresist in the first region comprises ashing off the residual photoresist in the first region with oxygen plasma.

8. The method according to claim 6, wherein the gate insulation layer and the etching stopping layer are formed of the same material; and
   ashing off the photoresist in the first region comprises ashing off the photoresist in the first region to remove the residual photoresist in the first region when a thickness of a remained material to be etched off in the second region is equal to an initial thickness of the portion of the etching stopping layer in the first region.

9. The method according to claim 8, wherein the gate insulation layer and the etching stopping layer are formed of silicon dioxide.

10. The method according to claim 1, further comprising depositing a source and drain electrode pattern on the substrate and forming a pixel electrode pattern above the source and drain electrode pattern after the step of performing a single etching process,
   wherein the source and drain electrode pattern is connected with a drain electrode of the switching transistor and a gate electrode of the driving transistor.

11. An array substrate manufactured by the method according to claim 1.

12. An array substrate manufactured by the method according to claim 2.

13. An array substrate manufactured by the method according to claim 3.

14. An array substrate manufactured by the method according to claim 4.

15. An array substrate manufactured by the method according to claim 5.

16. An array substrate manufactured by the method according to claim 6.

17. An array substrate manufactured by the method according to claim 7.

18. An array substrate manufactured by the method according to claim 8.

19. An array substrate manufactured by the method according to claim 9.

20. An array substrate manufactured by the method according to claim 10.

* * * * *